United States Patent
Tanaka et al.

(10) Patent No.: US 9,954,029 B2
(45) Date of Patent: Apr. 24, 2018

(54) RESISTANCE CHANGE MEMORY

(71) Applicant: KABUSHIKI KAISHA TOSHIBA, Minato-ku (JP)

(72) Inventors: Chika Tanaka, Yokohama (JP); Hiroki Noguchi, Yokohama (JP); Shinobu Fujita, Inagi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/054,706

(22) Filed: Feb. 26, 2016

(65) Prior Publication Data

US 2016/0181319 A1  Jun. 23, 2016

Related U.S. Application Data

(63) Continuation of application No. PCT/JP2015/068824, filed on Jun. 30, 2015.

(30) Foreign Application Priority Data

Sep. 17, 2014  (JP) .................... 2014-188737

(51) Int. Cl.
    H01L 27/22  (2006.01)
    H01L 43/08  (2006.01)

(52) U.S. Cl.
    CPC .................... *H01L 27/228* (2013.01)

(58) Field of Classification Search
    CPC ............... H01L 43/08; H01L 27/228
    See application file for complete search history.

(56) References Cited

U.S. PATENT DOCUMENTS 7,745,894 B2 *  6/2010  Asao ............... B82Y 10/00
                                                257/295
7,936,003 B2 *  5/2011  Kang ............... H01L 27/105
                                                257/314

(Continued)

FOREIGN PATENT DOCUMENTS

JP      2005-277189      10/2005
JP      2008-130995      6/2008

(Continued)

OTHER PUBLICATIONS

International Search Report dated Aug. 11, 2015 in PCT/JP2015/068824 filed Jun. 30, 2015 (with English Translation of Categories of Cited Documents).

(Continued)

*Primary Examiner* — Jarrett Stark
*Assistant Examiner* — Charles N Ausar-El
(74) *Attorney, Agent, or Firm* — Oblon, McClelland, Maier & Neustadt, L.L.P.

(57) ABSTRACT

According to one embodiment, a resistance change memory includes a semiconductor layer having a first surface in a first direction and a second surface in a second direction crossing the first direction, extending in a third direction crossing the first and second directions, and having first and second portions, a gate electrode covering the first and second surfaces between the first and second portions, a first conductive line connected to the first portion, a resistance change element having first and second terminals, the first terminal connected to the second portion, a second conductive line connected to the second terminal, and a third conductive line connected to the gate electrode.

13 Claims, 8 Drawing Sheets

(56) References Cited

U.S. PATENT DOCUMENTS

| | | | |
|---|---|---|---|
| 8,681,538 B2 | 3/2014 | Inaba | |
| 9,093,148 B2* | 7/2015 | Hatsuda | G11C 11/16 |
| 9,401,385 B2* | 7/2016 | Seo | H01L 27/228 |
| 9,570,510 B2* | 2/2017 | Kim | H01L 27/228 |
| 9,570,674 B2* | 2/2017 | Kim | H01L 43/10 |
| 2012/0008367 A1* | 1/2012 | Kajiyama | H01L 27/228 |
| | | | 365/148 |
| 2013/0033931 A1* | 2/2013 | Yamane | G11C 11/161 |
| | | | 365/171 |
| 2013/0134506 A1 | 5/2013 | Yagishita | |
| 2013/0210211 A1* | 8/2013 | Vereen | H01L 45/08 |
| | | | 438/382 |
| 2013/0221310 A1* | 8/2013 | Morikawa | H01L 45/144 |
| | | | 257/2 |
| 2014/0022836 A1* | 1/2014 | Kim | G11C 29/10 |
| | | | 365/158 |
| 2015/0109846 A1* | 4/2015 | Higo | H01L 43/08 |
| | | | 365/66 |
| 2016/0064061 A1* | 3/2016 | Shimizu | G11C 11/1677 |
| | | | 365/158 |
| 2016/0071566 A1* | 3/2016 | Noro | H03K 19/003 |
| | | | 365/51 |

FOREIGN PATENT DOCUMENTS

| | | |
|---|---|---|
| JP | 2009-164319 | 7/2009 |
| JP | 2012-19105 | 1/2012 |
| JP | 2012-203964 | 10/2012 |
| JP | 2013-115272 | 6/2013 |
| JP | 2013-162076 | 8/2013 |

OTHER PUBLICATIONS

Written Opinion dated Aug. 11, 2015 in PCT/JP2015/068824 filed Jun. 30, 2015.

International Search Report dated Aug. 11, 2015 in PCT/JP2015/068824 (English Translation only).

* cited by examiner

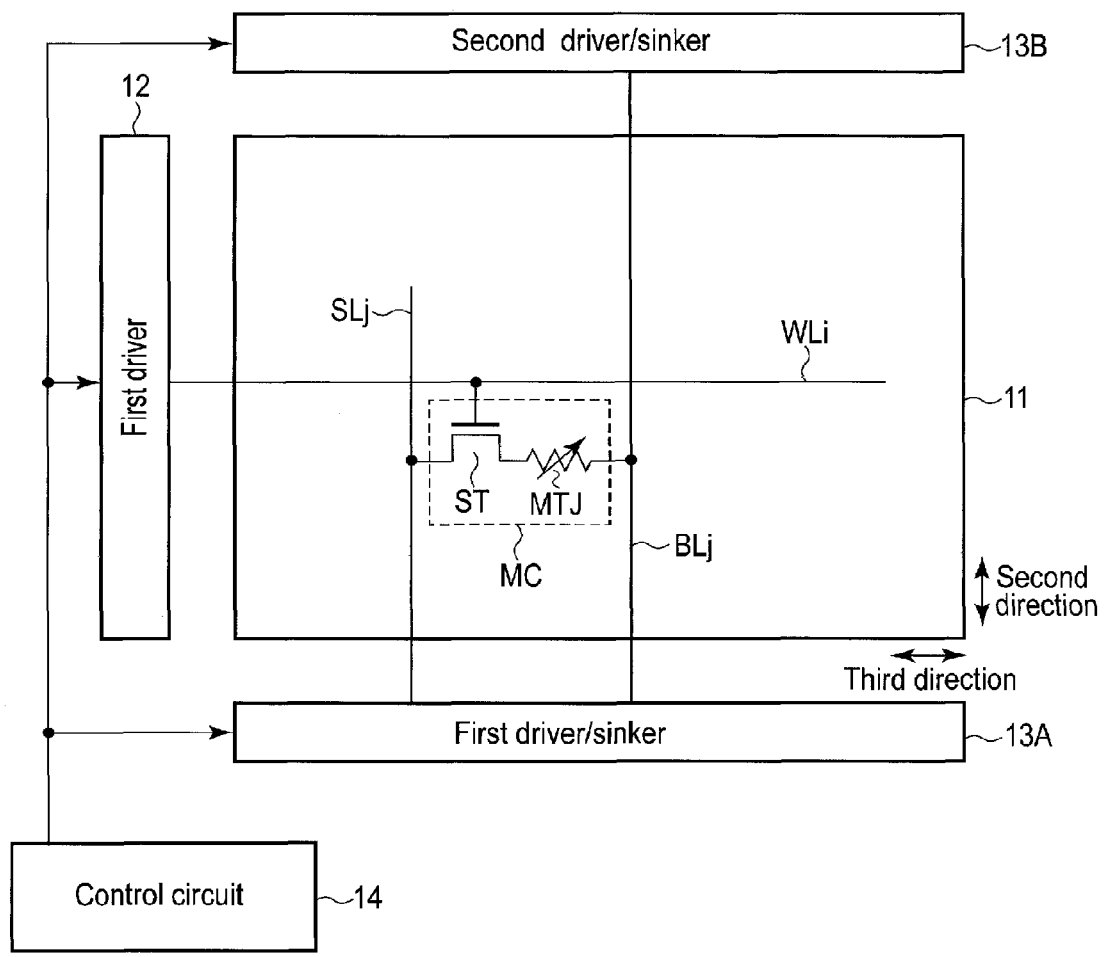
F I G. 1

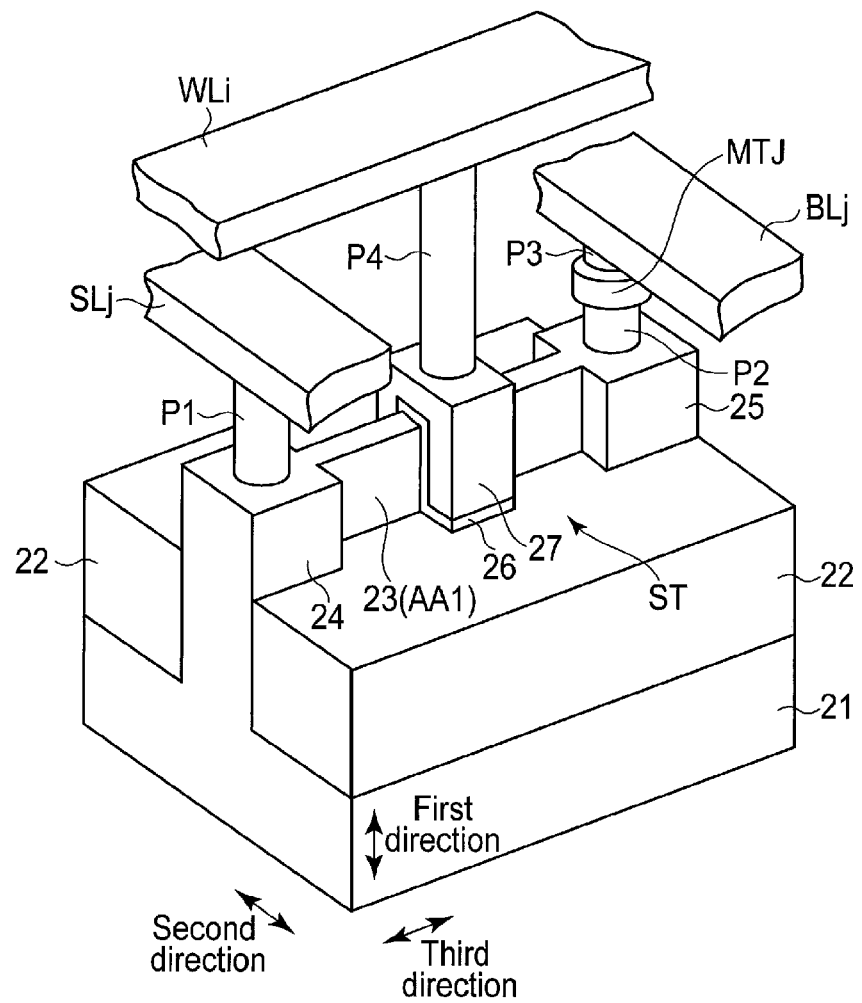
F I G. 2

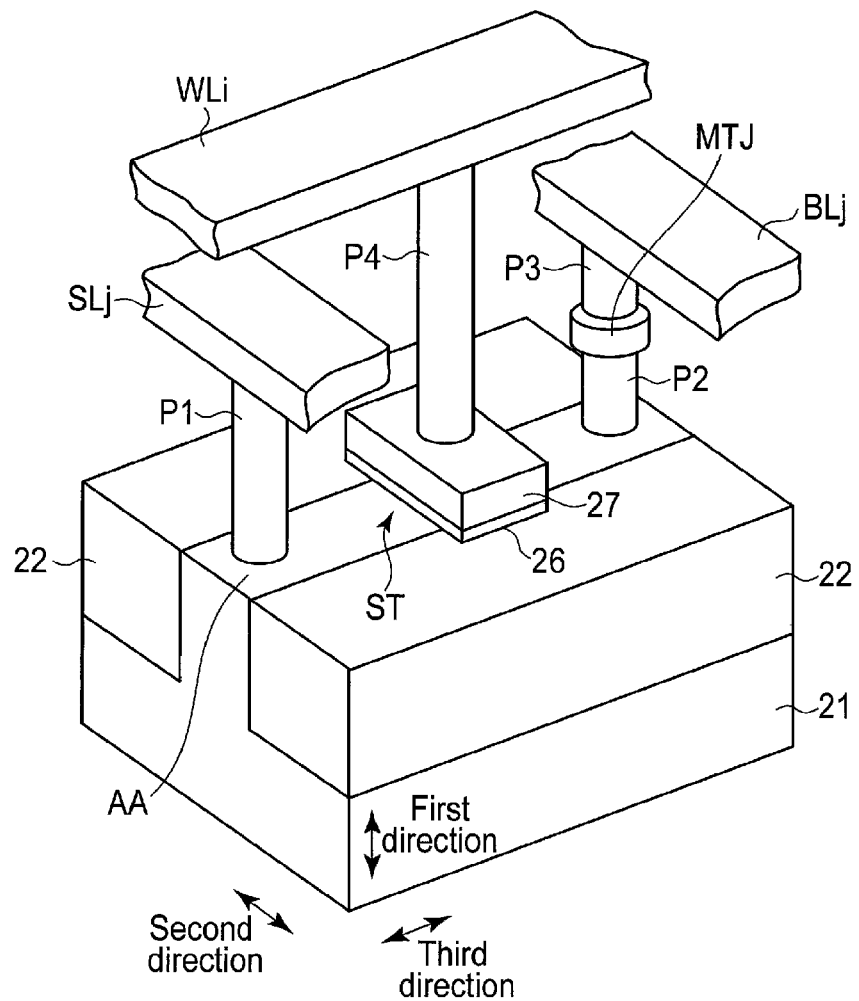
F I G. 3

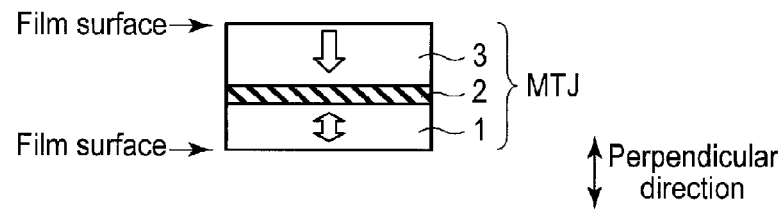
F I G. 4
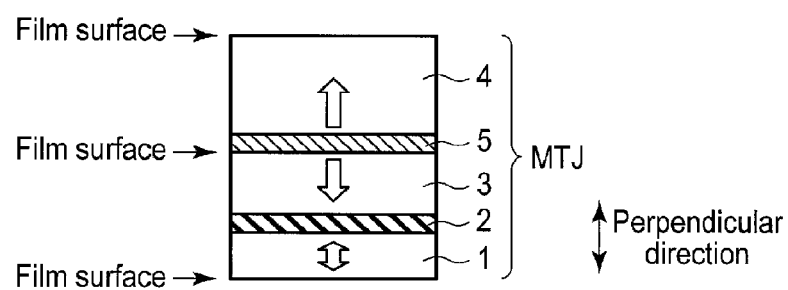
F I G. 5
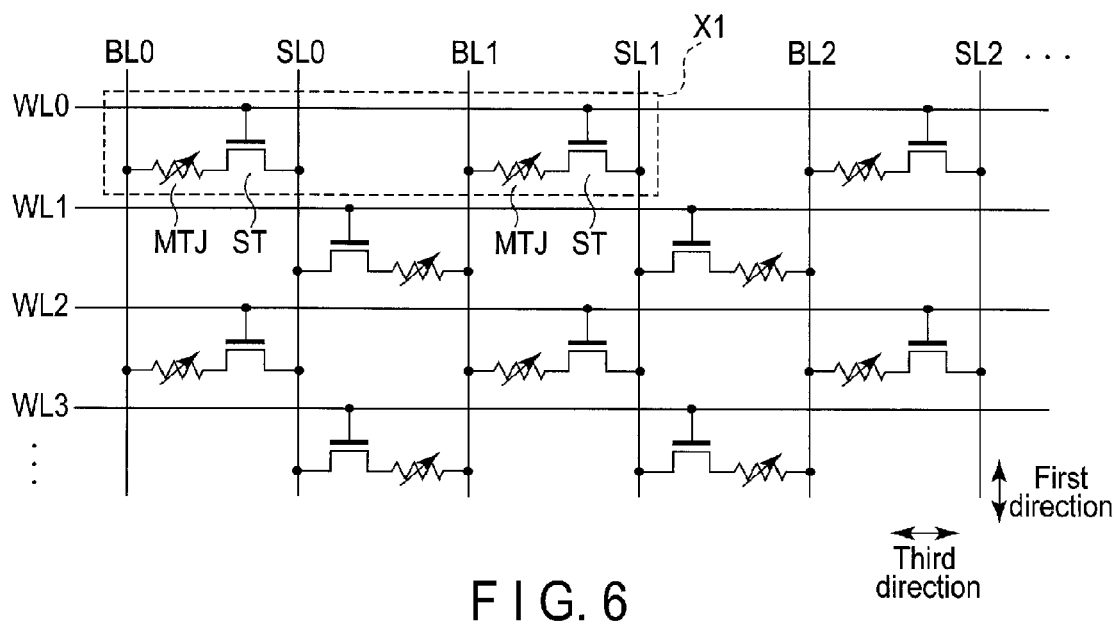
F I G. 6

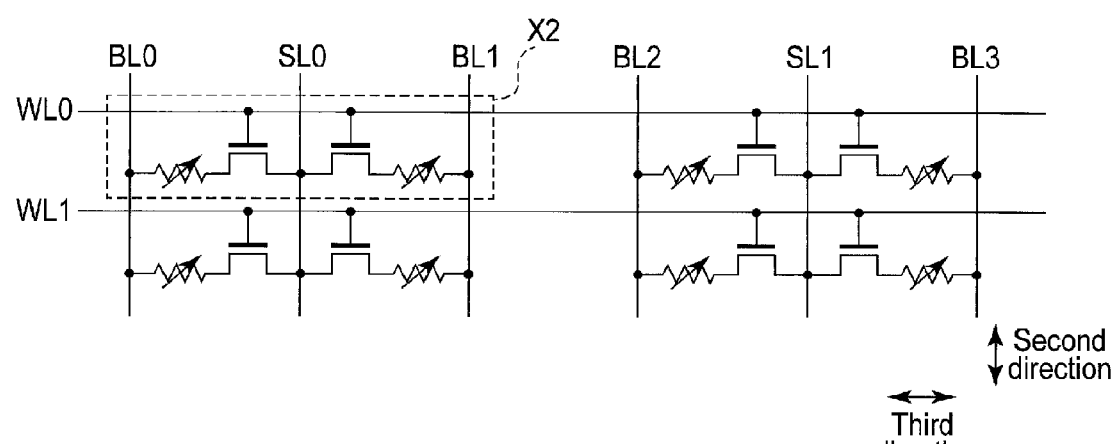
F I G. 8

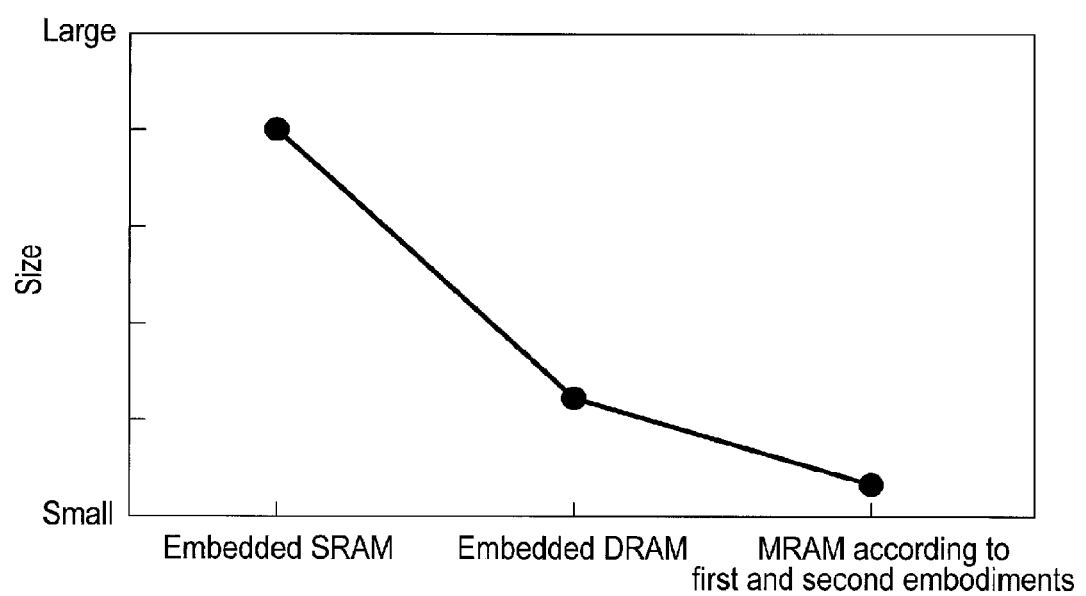
F I G. 10

… (1)

RESISTANCE CHANGE MEMORY

CROSS REFERENCE TO RELATED APPLICATIONS

This application is a Continuation Application of PCT Application No. PCT/JP2015/068824, filed Jun. 30, 2015 and based upon and claiming the benefit of priority from Japanese Patent Application No. 2014-188737, filed Sep. 17, 2014, the entire contents of all of which are incorporated herein by reference.

FIELD

Embodiments described herein relate generally to a resistance change memory.

BACKGROUND

A resistance change memory such as a spin-transfer-torque magnetic random access memory (STT-MRAM) has memory cells, each including, for instance, a resistance change element and a select transistor. For example, a planar field-effect transistor or a fin (cubic) field-effect transistor (FET) may be used as a select transistor.

Especially a fin field-effect transistor (fin-FET) has a fin-shaped active area where each of the upper surface and the side surfaces can be used as a channel area. Accordingly, even if a transistor is miniaturized, comparatively large driving force (channel width) will be secured. Therefore, a fin-FET is considered to be advantageous to integration.

However, the use of a transistor, such as a fin-FET, as a select transistor in a memory cell of a resistance change memory, such as an STT-MRAM, provokes a problem that, even if a transistor such as a fin-FET is miniaturized, the area of a memory cell cannot be made sufficiently small unless a word line, a bit line, and a source line, each connected to a memory cell, are appropriately laid out.

BRIEF DESCRIPTION OF THE DRAWINGS

FIG. 1 is a block diagram illustrating main parts of a resistance change memory.

FIG. 2 and FIG. 3 each are a perspective view illustrating an exemplary construction of the memory cell.

FIG. 4 and FIG. 5 each are a sectional view illustrating an exemplary resistance change element.

FIG. 6 is a circuit diagram illustrating a memory cell array in a first embodiment.

FIG. 8 is a circuit diagram illustrating a memory cell array in a second embodiment.

FIG. 10 is a view illustrating the advantage of an MRAM in each of the first and second embodiments.

DETAILED DESCRIPTION

Figure 7:
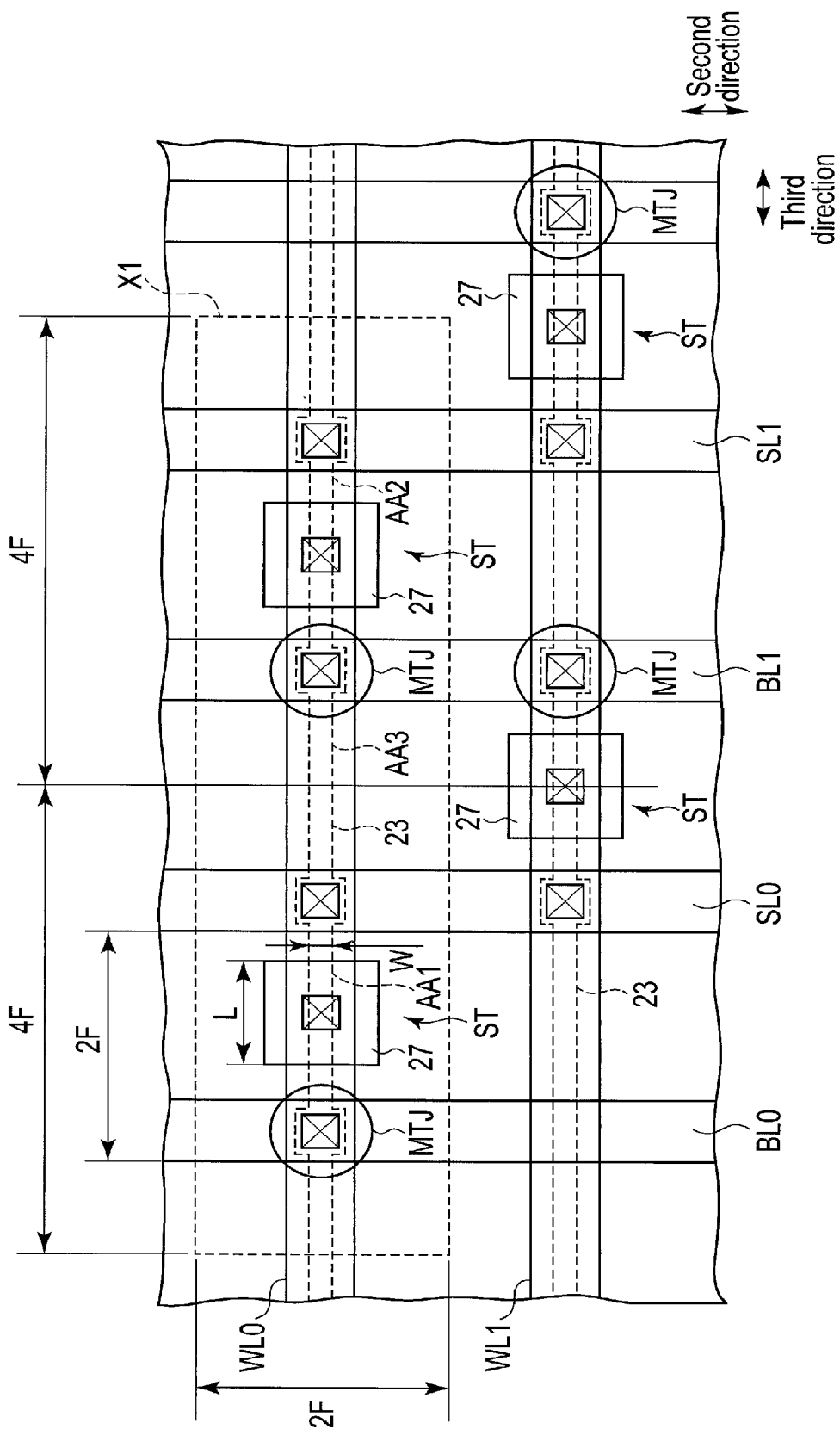
FIG. 7 is a plan view illustrating the layout of the memory cell array of FIG. 6.

In general, according to one embodiment, a resistance change memory comprises: a first semiconductor layer having a first surface in a first direction and a second surface in a second direction crossing the first direction, extending in a third direction crossing the first and second directions, and having first and second portions; a first gate electrode covering the first and second surfaces between the first and second portions; a first conductive line connected to the first portion, and extending in a direction crossing the first and third directions; a first resistance change element having first and second terminals, the first terminal connected to the second portion; a second conductive line connected to the second terminal, and extending in a direction crossing the first and third directions; and a third conductive line connected to the first gate electrode, and extending in a direction crossing the first and second directions, wherein the first and second conductive lines are provided between the first semiconductor layer and the third conductive line.

Hereafter, embodiments will be described with reference to the drawings.

1. Resistance Change Memory (1) Main Parts

FIG. 1 illustrates the scheme of a resistance change memory.

A memory cell array 11 includes a memory cell MC. The memory cell MC comprises a series connection of a select transistor (for example, an FET) ST and a resistance change element MTJ. The resistance change element MTJ is a magnetoresistive element, for example.

The select transistor ST has a gate, to which a word line WLi is connected. Word line WLi is driven by a first driver 12. The memory cell MC has two ends, one of which is connected to a source line SLj and the other to a bit line BLj. Source line SLj is driven by a first driver/sinker 13A. Bit line BLj is driven by a second driver/sinker 13B.

A control circuit 14 controls operation of the first driver 12, the first driver/sinker 13A, and the second driver/sinker 13B at the time of reading/writing data from/to the memory cell MC.

For example, the control circuit 14 causes the first driver 12 to make word line WLi high at a reading/writing time. Here, high is a potential which makes the select transistor ST conduct.

Moreover, the control circuit 14 controls the first and second drivers/sinkers 13A and 13B in order to make one of source line SLj and bit line BLj higher in potential than the other at a writing time, for example. Namely, when a current is made to flow from source line SLj to bit line BLj, binary 1 is written to the resistance change element MTJ, whereas, when a current is made to flow from bit line BLj to source line SLj, binary 0 is written to the resistance change element MTJ.

Furthermore, at a reading time, the control circuit 14 controls the first and second drivers/sinkers 13A and 13B in order to establish source line SLj as ground potential and connect bit line BLj to a sense amplifier, for example.

It should be noted that it is possible for the memory cell MC in the present embodiment to change position between the select transistor ST and the resistance change element MTJ. Alternatively, it is possible to change position between source line SLj and the position of bit line BLj.

(2) Exemplary Constructions of Memory Cell

FIG. 2 and FIG. 3 each illustrate an exemplary construction of a memory cell.

Specifically, FIG. 2 illustrates an exemplary construction which uses a fin-FET as a select transistor ST, and FIG. 3 illustrates an exemplary construction which uses a planar-FET as a select transistor ST.

First of all, the exemplary construction of FIG. 2 will be explained.

A semiconductor substrate 21 is a single-crystal-silicon substrate, for example. A fin-shaped active area AA1 is on the semiconductor substrate 21. An element separation insulating layer 22 comprises insulating layer portions (for example, silicon oxide layer portions) filled in the respective trenches in the semiconductor substrate 21 and holding fin-shaped active area AA1 in between. Accordingly, the element separation insulating layer 22 has a shallow trench isolation structure (an STI structure).

Fin-shaped active area AA1 has an upper surface, which faces in a first direction (a perpendicular direction perpendicular to the upper surface of the semiconductor substrate 21), and side surfaces, each of which extends in a second direction perpendicularly crossing the first direction, and extends in a third direction that perpendicularly crosses the first and second axes.

Fin-shaped active area AA1 extending in the third direction has two ends, which are opposite to each other and are distant from each other in the third direction. One of the two ends is a first end connected to a contact section 24, and the other a second end connected to a contact section 25. Contact sections 24 and 25 and a part of fin-shaped active area AA1 individually have a source/drain area which is made low in resistance by impurities. Contact plugs P1 and P2 are respectively in contact with contact sections 24 and 25.

In the present embodiment, each of contact sections 24 and 25 is wider than fin-shaped active area AA1 in width which extends in the second direction. This arrangement is significantly important because it is this arrangement that prevents destruction of fin-shaped active area AA1 when a memory cell is miniaturized, and that prevents the poor contact caused by a gap which may occur between contact plug P1 and contact section 24 or a gap which may occur between contact plug P2 and contact section 25.

The select transistor ST comprises fin-shaped active area AA1 as a channel, and a gate insulating layer 26 and a gate electrode 27 which partially cover the upper and side surfaces of fin-shaped active area AA1. Here, the driving force (channel width) of the select transistor ST is determined by the sum total of the width of the upper surface of fin-shaped active area AA1 extending in the second direction and the widths of the respective side surfaces of fin-shaped active area AA1 extending in the first direction.

The fin-FET in the present embodiment therefore is advantageous to miniaturization because it can secure a large driving force compared with the planar-FET.

Contact plug P1 connects source line (first conductive line) SLj to contact section 24. Contact plug P2 connects the resistance change element MTJ to contact section 25. A contact plug P3 connects a bit line (second conductive line) BLj to the resistance change element MTJ.

Both source line SLj and bit line BLj extend in the second direction.

It is one of the features of the present embodiment that both source line SLj and bit line BLj extend in the second direction perpendicularly crossing the third direction in which fin-shaped active area AA1 extends. This eliminates the need for arranging a conductive layer as an intermediate layer between source line SLj and contact section 24 and between bit line BLj and contact section 25. Therefore, a memory cell will be reduced in size by the number of eliminated conductive layers.

A contact plug P4 connects a word line (third conductive line) WLi to the gate electrode 27. Word line WLi extends in the third direction.

It is another feature of the present embodiment that word line WLi extends in the third direction in which fin-shaped active area AA1 extends, and that word line WLi is above source line SLj and bit line BLj. This makes it possible to make word line WLi and fin-shaped active area AA1 overlap each other in the first direction, resulting in reduction in size of a memory.

Subsequently, the exemplary construction of FIG. 3 will be explained.

The exemplary construction of FIG. 3 is different from the exemplary construction of FIG. 2 in that a select transistor ST is a planar-FET, but is the same as the exemplary construction of FIG. 2 in the remaining points. Here, only points that are different from those of the exemplary construction of FIG. 2 will be explained, but the remaining portions that are the same as those of the exemplary construction of FIG. 2 will be denoted by the same reference numbers and their detailed explanations will be omitted.

An active area AA is between the portions of an element separation insulating layer 22 having an STI structure. The select transistor ST comprises the active area AA extending in the third direction, a gate insulating layer 26, and a gate electrode 27. The active area AA functions as a channel, and has two ends opposite to each other and distant from each other in the third direction. The active area AA further has an upper surface partially covered with a combination of the gate insulating layer 26 and the gate electrode 27.

One of the two ends of the active area AA is a first end which is connected to a source line (first conductive line) SLj by a contact plug P1. The other of the two ends of the active area AA is a second end which is connected to a resistance change element MTJ by a contact plug P2. The first and second ends of the active area AA each have a source/drain area made low in resistance by impurities.

A contact plug P3 connects a bit line (second conductive line) BLj to the resistance change element MTJ. A contact plug P4 connects a word line (third conductive line) WLi to the gate electrode 27. Both source line SLj and bit line BLj extend in the second direction, and word line WLi extends in the third direction.

In this way, in the exemplary constructions of FIG. 2 and FIG. 3, only three conductive lines (word line WLi, bit line BLj, and source line SLj) are connected to one memory cell, and excessive conductive lines (the intermediate layer, etc.) are not connected to it. Therefore, miniaturization of a memory cell can be achieved to the utmost according to miniaturization of the select transistor ST, for example.

(3) Exemplary Resistance Change Element

FIG. 4 and FIG. 5 each illustrate an exemplary resistance change element.

FIG. 4 illustrates the basic structure of a magnetoresistive element as a resistance change element.

The magnetoresistive element MTJ has a laminated structure in which a memory layer (ferromagnetic layer) 1 having perpendicularly variable magnetization perpendicular to the film surface, a tunnel barrier layer (insulating layer) 2, and a reference layer (ferromagnetic layer) 3 having perpendicularly variable magnetization are arranged in the mentioned order.

Here, invariable magnetization means that the magnetization direction does not change before and after writing, whereas variable magnetization means that the magnetization direction may reversely change before and after writing.

Moreover, writing means spin transfer writing which gives spin torque to magnetization of the memory layer 1 by causing a spin injection current (spin-polarized electrons) to flow through the magnetoresistive element MTJ.

For example, when a spin injection current is made to flow from the memory layer 1 to the reference layer 3, electrons which are spin-polarized in the same direction as the magnetization direction of the reference layer 3 flow into the memory layer 1. Spin torque is given to the magnetization in the memory layer 1. Accordingly, the magnetization direction of the memory layer 1 becomes the same (parallel state) as the magnetization direction of the reference layer 3.

In contrast, when a spin injection current is made to flow from the reference layer 3 to the memory layer 1, such electrons that belong to electrons travelling from the memory layer 1 to the reference layer 3 and are spin-polarized reversely to the magnetization direction of the reference layer 3 will be returned to the memory layer 1 and give spin torque to the magnetization in the memory layer 1. Accordingly, the magnetization direction of the memory layer 1 becomes reverse to the magnetization direction of the reference layer 3 (antiparallel state).

The magnetoresistive element MTJ will change in resistance because of the magnetoresistive effect depending on the relative magnetization direction determined by the reference layer 3 and the memory layer 1. Namely, the magnetoresistive element MTJ will be low in resistance when it assumes a parallel state, whereas it will be high in resistance when it assumes an antiparallel state. The quantity (R1−R0)/R0, where R0 is the resistance in the parallel state and R1 is the resistance in the antiparallel state, is called the magnetoresistive (MR) ratio.

In the present example, the reference layer 3 is fixedly magnetized toward a memory layer. However, the reference layer 3 may be fixedly magnetized reversely to the memory layer 1. Moreover, when the magnetoresistive element MTJ is arranged on a semiconductor substrate, it does not matter whether the magnetoresistive element MTJ is on the top of or the bottom of the semiconductor substrate.

For example, when the reference layer 3 is upper than the memory layer 1, the magnetoresistive element MTJ is called a top pin type, and when the reference layer 3 is lower than the memory layer 1, the magnetoresistive element MTJ is called a bottom pin type.

FIG. 5 illustrates an exemplary magnetoresistive element which has a shift cancellation layer.

The magnetoresistive element MTJ has a laminated structure in which a memory layer (ferromagnetic layer) 1 having perpendicularly variable magnetization perpendicular to the film surface, a tunnel barrier layer (insulating layer) 2, and a reference layer (ferromagnetic layer) 3 having perpendicularly invariable magnetization are arranged in the mentioned order.

Moreover, the magnetoresistive element MTJ further has at the reference layer 3 side a shift cancellation layer (ferromagnetic layer) 4 having perpendicular and invariable magnetization. Between the reference layer 3 and the shift cancellation layer 4, a nonmagnetic layer (for example, metal layer) 5 is arranged.

In the present embodiment, the reference layer 3 and the memory layer 1 are perpendicularly magnetized. In this case, the leakage magnetic field (stray magnetic field) from the reference layer 3 will accord in direction with the magnetization of the (perpendicularly magnetized) memory layer 1, the leakage magnetic field which has a large perpendicular component will be applied to the memory layer 1. This leakage magnetic field acts in the direction which makes the magnetization direction of the memory layer 1 the same as the magnetization direction of the reference layer 3 (in a parallel state).

Therefore, RH curve of the memory layer 1 shifts.

Specifically, the magnetoresistive element MTJ can be changed from an antiparallel state to a parallel state only by causing small spin injection current to flow through the magnetoresistive element MTJ. On the other hand, in order to change the magnetoresistive element MTJ from a parallel state to an antiparallel state, large spin injection current is required to flow through the magnetoresistive element MTJ.

Moreover, the leakage magnetic field from the reference layer 3 makes an antiparallel state unstable.

When a leakage magnetic field becomes larger than the coercive force of the memory layer 1, it will become impossible for the memory layer 1 to hold an antiparallel state. Moreover, even if a leakage magnetic field is smaller than the coercive force of the memory layer 1, a leakage magnetic field may cause magnetization of the memory layer 1 to change from an antiparallel state to a parallel state when consideration is given to fluctuation of magnetization caused by thermal turbulence.

The shift cancellation layer 4 is provided in order to solve such a problem.

In the present embodiment, the reference layer 3 and the shift cancellation layer 4 are placed one upon another. In this case, the magnetization direction of the shift cancellation layer 4 is set to be reverse to the magnetization direction of the reference layer 3. Thereby, the leakage magnetic field which leaks from the reference layer 3 to the memory layer 1 is canceled by the cancellation magnetic field from the shift cancellation layer 4. It becomes possible to cancel the shift of RH curve of the memory layer 1.

2. First Embodiment

FIG. 6 illustrates the memory cell array in the first embodiment. FIG. 7 illustrates the layout of the memory cell array of FIG. 6.

The first embodiment relates to what is called a two-transistor two-element type memory cell array, in which one memory cell comprises two select transistors and two resistance change elements. The area X1 in FIG. 6 or FIG. 7 is equivalent to the memory cell which holds one bit.

A fin-shaped active area AA1 corresponds to a fin-shaped active area AA1 of FIG. 2, for example. A fin-shaped active area AA2 is the same in structure as fin-shaped active area AA1. A fin-shaped active area AA3 connects two fin-shaped active areas AA1 and AA2. Fin-shaped active areas AA1, AA2, and AA3 are linearly arranged, and unitarily extend in the third direction.

Fin-shaped active areas AA1 and AA2 are covered with the respective gate electrodes 27. Every gate electrode 27 has a width L which extends in the third direction and corresponds to the channel length of the select transistor ST. W stands for a width which extends in the second direction and which fin-shaped active areas AA1 and AA2 individually have.

A word line WL0 extends in the third direction with overlapping with fin-shaped active areas AA1, AA2, and AA3. Moreover, word line WL0 is connected in common to one of the gate electrodes 27 which covers fin-shaped active area AA1, and another of the gate electrodes 27 which covers fin-shaped active area AA2.

Each of source lines SL0 and SL1 is connected through a corresponding one of contact plugs to a corresponding one of the first end of fin-shaped active area AA1 in the third direction and the first end of fin-shaped active area AA2 in the third direction. Each of bit lines BL0 and BL1 is connected through a corresponding one of the magnetoresistive element MTJ to a corresponding one of the second end of fin-shaped active area AA1 in the third direction and the second end of fin-shaped active area AA2 in the third direction.

In the layout of the first embodiment, when a pitch from source line SL0 to bit line BL0 is defined as 2F, the size of one memory cell (an area X1) is prescribed by 2F (which extends in the second direction)×8F (which extends in the third direction), for example. Here, F stands for a future size and represents the minimum working dimension in each generation of a resistance change memory, for example.

Figure 9:
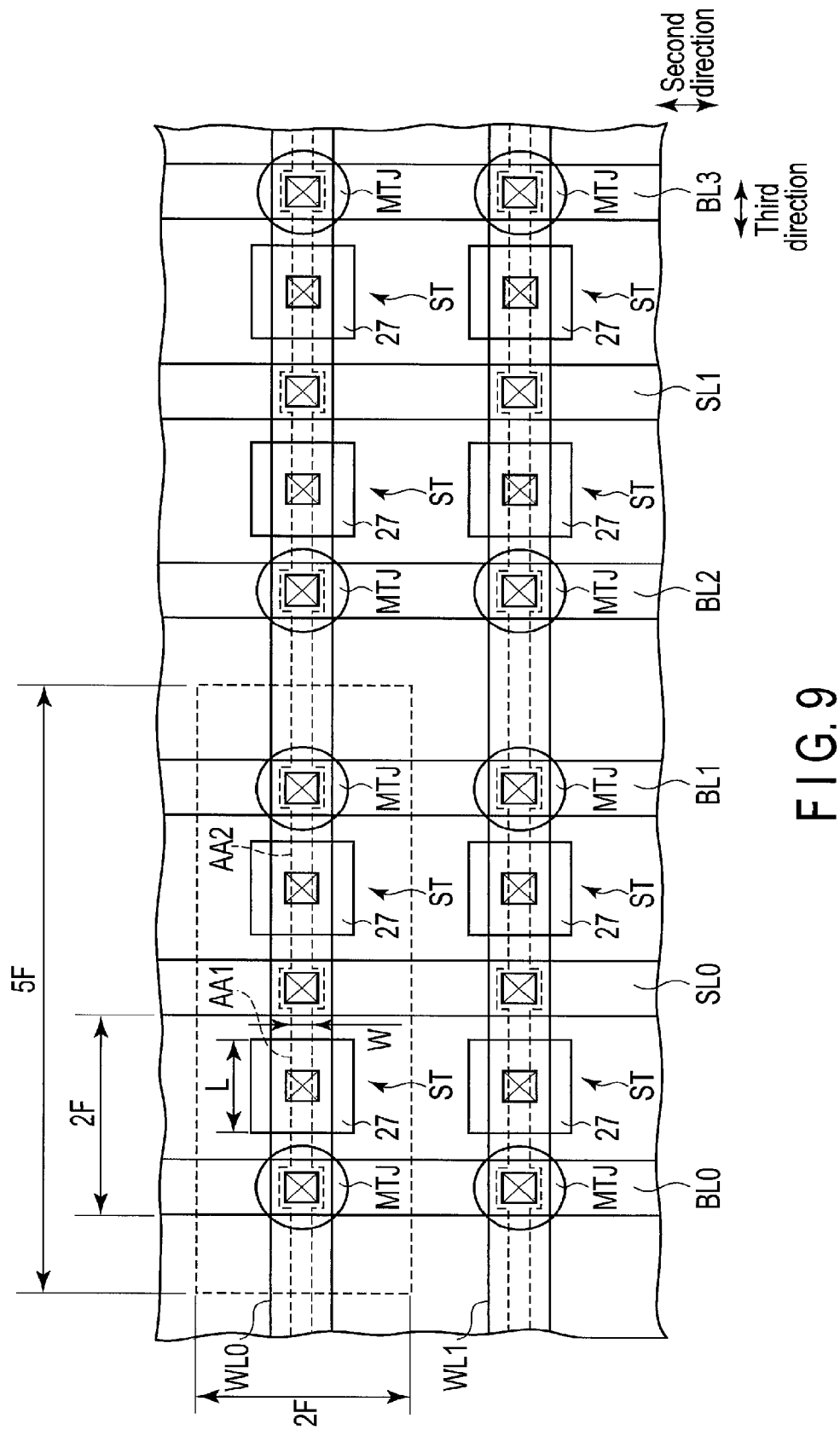
FIG. 9 is a plan view illustrating the layout of the memory cell array of FIG. 8.

FIG. 8 illustrates a memory cell array in the second embodiment. FIG. 9 illustrates the layout of the memory cell array of FIG. 8.

The second embodiment also relates to what is called a two-transistor two-element type memory cell array, in which one memory cell comprises two select transistors and two resistance change elements. In FIG. 8 and FIG. 9, an area X2 is equivalent to a memory cell which holds one bit.

The point that the second embodiment is different from the first embodiment resides in that one source line SL0 in every memory cell is connected to two select transistors ST in common.

A fin-shaped active area AA1 corresponds to a fin-shaped active area AA1 of FIG. 2, for example. A fin-shaped active area AA2 is the same in structure as fin-shaped active area AA1. Fin-shaped active areas AA1 and AA2 are linearly arranged, and unitarily extend in the third direction.

Fin-shaped active areas AA1 and AA2 are covered with the respective gate electrodes 27. Every gate electrode 27 has a width L which extends in the third direction and which corresponds to the channel length of the select transistor ST. W stands for a width which extends in the second direction and which fin-shaped active areas AA1 and AA2 individually have.

A word line WL0 extends in the third direction with overlapping with fin-shaped active areas AA1 and AA2. Moreover, word line WL0 is connected in common to one of the gate electrodes 27 which covers fin-shaped active area AA1, and another of the gate electrodes 27 which covers fin-shaped active area AA2.

A source line SL0 is connected through a contact plug to both the first end of fin-shaped active area AA1 in the third direction and the first end of fin-shaped active area AA2 in the third direction. Each of bit lines BL0 and BL1 is connected through a corresponding one of the magnetoresistive element MTJ to a corresponding one of the second end of fin-shaped active area AA1 in the third direction and the second end of fin-shaped active area AA2 in the third direction.

In the layout of the second embodiment, when a pitch from source line SL0 to bit line BL0 is defined as 2F, the size of one memory cell (an area X2) is prescribed by 2F (which extends in the second direction)×5F (which extends in the third direction), for example. Accordingly, the second embodiment can reduce the size of every memory cell in the third direction compared with the first embodiment.

Furthermore, in the second embodiment, the number of conductive lines (bit lines BL0 and BL1, and source line SL0) arranged in the third direction is three in every memory cell. This means that 1.5 conductive lines are connected to the one transistor ST and the one magnetoresistive element MTJ.

In contrast, in the first embodiment, the number of conductive lines (bit lines BL0 and BL1, and source lines SL0 and SL1) arranged in the third direction is four in every memory cell. This means that two conductive lines are connected to one of the transistors ST and one of the magnetoresistive elements MTJ.

4. Advantage

FIG. 10 illustrates the advantage of an MRAM in each of the first and second embodiments.

It is apparent that miniaturization of a select transistor effectively promotes miniaturization of a memory cell in either embodiment. Therefore, the cell size of an MRAM in either of the embodiments can be made smaller than the cell size of a consolidated SRAM (Embedded SRAM), a consolidated DRAM (Embedded DRAM), etc.

5. Conclusion

Both the embodiments promote the miniaturization of a memory cell and the miniaturization of a layout to connect a memory cell to a word line, a bit line, and a source line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a first semiconductor layer having a first surface vertical to a first direction and second surfaces opposed to each other in a second direction crossing the first direction, the first semiconductor layer including first and second portions which are arranged in a third direction crossing the first and second directions;
   a first gate electrode covering the first surface and the second surfaces, which are provided between the first and second portions;
   a first conductive line electrically connected to the first portion, and extending with a greatest dimension in a direction crossing the first and third directions, a pattern of the first conductive line has a portion located outside a pattern of the first portion as viewed from a direction parallel to the first direction;
   a first resistance change element having first and second terminals, the first terminal electrically connected to the second portion;
   a second conductive line electrically connected to the second terminal, and extending with a greatest dimension in a direction crossing the first and third directions, a pattern of the second conductive line has a portion located outside a pattern of the second portion as viewed from a direction parallel to the first direction; and
   a third conductive line electrically connected to the first gate electrode, and extending with a greatest dimension in the third direction,
   wherein the first and second conductive lines are provided between the first semiconductor layer and the third conductive line.

2. The memory of claim 1, wherein
   the first semiconductor layer and the third conductive line are overlapped in the first direction.

3. The memory of claim 1, further comprising:
   a second semiconductor layer having a third surface vertical to the first direction and fourth surfaces opposed to each other in the second direction, the second semiconductor layer including third and fourth portions which are arranged in the third direction;
   a second gate electrode covering the third surface and the fourth surfaces, which are provided between the third and fourth portions;
   a fourth conductive line connected to the third portion, and extending with a greatest dimension in a direction crossing the first and third directions, a pattern of the fourth conductive line has a portion located outside a pattern of the third portion as viewed from a direction parallel to the first direction;

a second resistance change element having third and fourth terminals, the third terminal connected to the fourth portion;

a fifth conductive line connected to the fourth terminal, and extending with a greatest dimension in a direction crossing the first and third directions, a pattern of the fifth conductive line has a portion located outside a pattern of the fourth portion as viewed from a direction parallel to the first direction; and a third semiconductor layer connected between the first and fourth portions, wherein the third conductive line is connected to the second gate electrode, and the fourth and fifth conductive lines are provided between the second semiconductor layer and the third conductive line.

4. The memory of claim 1, further comprising:

a second semiconductor layer having a third surface vertical to the first direction and fourth surfaces opposed to each other in the second direction, the second semiconductor layer including third and fourth portions which are arranged in the third direction;

a second gate electrode covering the third surface and the fourth surfaces, which are provided between the third and fourth portions;

a second resistance change element having third and fourth terminals, the third terminal connected to the third portion; and a fourth conductive line connected to the fourth terminal, and extending with a greatest dimension in a direction crossing the first and third directions, a pattern of the fourth conductive line has a portion located outside a pattern of the third portion as viewed from a direction parallel to the first direction;

wherein the fourth portion is connected to the first portion, the first conductive line is connected to the fourth portion, the third conductive line is connected to the second gate electrode, and the fourth conductive line is provided between the second semiconductor layer and the third conductive line.

5. The memory of claim 1, further comprising:

a substrate on an upper face of which the first semiconductor layer is provided, wherein the first direction is a direction perpendicular to the upper face of the semiconductor substrate.

6. The memory of claim 5, wherein the substrate comprises a semiconductor substrate and an insulating layer provided on a first part of an upper face of the semiconductor substrate, the semiconductor substrate and the first semiconductor layer connected to each other via a second part other than the first part of the upper face of the semiconductor substrate.

7. The memory of claim 1, wherein a length of each of the first and second portions is greater than a length of the first semiconductor layer except the first and second portions in the second direction.

8. The memory of claim 1, wherein the first resistance change element is a magnetoresistive element.

9. A resistance change memory comprising:

a semiconductor layer having a first surface vertical to a first direction and second surfaces opposed to each other in a second direction crossing the first direction, the semiconductor layer including first and second portions which are arranged in a third direction crossing the first and second directions;

a gate electrode covering the first surface between the first and second portions;

a first conductive line electrically connected to the first portion, and extending with a greatest dimension in a direction crossing the first and third directions, a pattern of the first conductive line has a portion located outside a pattern of the first portion as viewed from a direction parallel to the first direction;

a resistance change element having first and second terminals, the first terminal electrically connected to the second portion;

a second conductive line electrically connected to the second terminal, and extending with a greatest dimension in a direction crossing the first and third directions, a pattern of the second conductive line has a portion located outside a pattern of the second portion as viewed from a direction parallel to the first direction; and a third conductive line electrically connected to the gate electrode, and extending with a greatest dimension in the third direction, wherein the first and second conductive lines are provided between the semiconductor layer and the third conductive line.

10. The memory of claim 9, wherein the semiconductor layer and the third conductive line are overlapped in the first direction.

11. The memory of claim 9, wherein the semiconductor layer is a semiconductor substrate.

12. The memory of claim 9, wherein a length of each of the first and second portions is greater than a length of the semiconductor layer except the first and second portions in the second direction.

13. The memory of claim 9, wherein the resistance change element is a magnetoresistive element.

* * * * *